United States Patent
Ivanov et al.

(10) Patent No.: US 8,836,377 B1
(45) Date of Patent: Sep. 16, 2014

(54) SAMPLED REFERENCE SUPPLY VOLTAGE SUPERVISOR

(71) Applicant: Texas Instruments Incorporated, Dallas, TX (US)

(72) Inventors: Vadim Valerievich Ivanov, Denton, TX (US); Ravi Balasingam, Tucson, AZ (US); Ritu Shree, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/869,634

(22) Filed: Apr. 24, 2013

Related U.S. Application Data

(60) Provisional application No. 61/779,352, filed on Mar. 13, 2013.

(51) Int. Cl.
*H03K 5/153* (2006.01)
(52) U.S. Cl.
USPC .......................................................... 327/74
(58) Field of Classification Search
USPC .................................................. 327/74–76
See application file for complete search history.

(56) References Cited

U.S. PATENT DOCUMENTS

| | | | |
|---|---|---|---|
| 7,714,550 B2 * | 5/2010 | Houk et al. | 323/272 |
| 2006/0061372 A1 * | 3/2006 | Hayakawa et al. | 324/679 |
| 2011/0260041 A1 * | 10/2011 | Machida | 250/208.2 |
| 2011/0291678 A1 * | 12/2011 | Pflum et al. | 324/705 |

* cited by examiner

*Primary Examiner* — Quan Tra
(74) *Attorney, Agent, or Firm* — William B. Kempler; Frederick J. Telecky, Jr.

(57) ABSTRACT

A power supervisor circuit is provided. The circuit includes a first sample circuit that periodically samples a first reference voltage derived from a high output rail of a voltage source and generates a first sampled output voltage. The circuit includes second sample circuit that periodically samples a second reference voltage associated with a low output rail of the voltage source and generates a second sampled output voltage. A voltage supervisor in the circuit generates a trip point signal when a combination of the first and second sampled output voltage crosses a predetermined threshold indicating that the voltage source output voltage has fallen below a desired output voltage.

20 Claims, 5 Drawing Sheets

SAMPLED REFERENCE SUPPLY VOLTAGE SUPERVISOR

CROSS-REFERENCE TO RELATED APPLICATION

This application claims the benefit of U.S. Provisional Patent Application 61/779,352 filed on Mar. 13, 2013, and entitled SAMPLED REFERENCE SUPPLY VOLTAGE SUPERVISOR, the entirety of which is incorporated by reference herein.

TECHNICAL FIELD

This disclosure relates to power monitor circuits, and more particularly to circuits that monitor voltage sources for over-voltage or under-voltage conditions.

BACKGROUND

Voltage supervisors are employed in many applications to detect over-voltage or under-voltage conditions of a power supply. In one example, the power supply for a mobile device is a battery that is monitored by the voltage supervisor to detect low battery conditions. If the battery voltage drops below a given threshold, the voltage supervisor can detect the condition by comparing the battery voltage to the threshold. The voltage supervisor can then signal the processing elements in the mobile device to alert the user and in very low voltage cases, can initiate an orderly shutdown of the device. One issue with existing voltage supervisor circuits is that they employ resistive voltage dividers to establish the threshold voltage. Such dividers draw current the entire time the device is in operation and thus, over time can cause the battery voltage to drain undesirably.

SUMMARY

This disclosure relates to systems and methods for monitoring a power supply to detect under-voltage or over-voltage conditions in the supply. In one example, a circuit is provided. The circuit includes a first sample circuit that periodically samples a first reference voltage derived from a high output rail of a voltage source and generates a first sampled output voltage. The circuit includes second sample circuit that periodically samples a second reference voltage associated with a low output rail of the voltage source and generates a second sampled output voltage. A voltage supervisor in the circuit generates a trip point signal when a combination of the first and second sampled output voltage crosses a predetermined threshold indicating that the voltage source output voltage has fallen below a desired output voltage.

In another example, an integrated circuit includes a first sample circuit that periodically samples a first reference voltage derived from a high output rail of a voltage source and generates a first sampled output voltage. The integrated circuit includes a second sample circuit that periodically samples a second reference voltage associated with a low output rail of the voltage source and generates a second sampled output voltage. This includes a third sample circuit that periodically samples a third reference voltage derived from the high output rail of the voltage source and generates a third sampled output voltage. A comparator monitors the first sampled output voltage and the second sampled output voltage from the first and second sample circuits and generates a trip point signal based on the voltage source output voltage crossing a predetermined threshold, wherein the third sampled output voltage is monitored to add hysteresis to the comparator by setting a hysteresis threshold for the comparator.

In yet another example, an integrated circuit includes a first sample circuit that periodically samples a first reference voltage derived from a high output rail of a voltage source and generates a first sampled output voltage. This includes a second sample circuit that periodically samples a second reference voltage associated with a low output rail of the voltage source and generates a second sampled output voltage. The integrated circuit includes a third sample circuit that periodically samples a third reference voltage derived from the high output rail of the voltage source and generates a third sampled output voltage, wherein the first reference voltage, the second reference voltage, and third reference voltage are periodically enabled prior to being sampled by the first, the second, and the third sample circuits and disabled after being sampled by the first, the second, and the third sample circuits to conserve power in the generation of the first, the second, and the third reference voltages. A comparator monitors the first sampled output voltage and the second sampled output voltage from the first and the second sample circuits and generates a trip point signal based on the voltage source output voltage crossing a predetermined threshold. The third sampled output voltage is monitored to add hysteresis to the comparator by setting a hysteresis threshold for the comparator.

DETAILED DESCRIPTION

Figure 1:
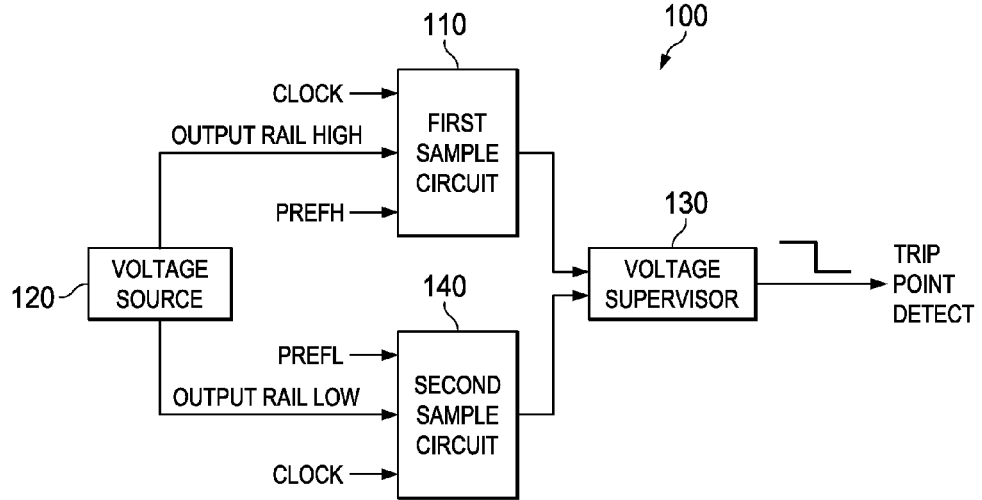
FIG. 1 illustrates a voltage supervisor circuit that employs sampled reference voltages to conserve power in the circuit.

FIG. 1 illustrates a voltage supervisor circuit 100 that employs sampled reference voltages to conserve power in the circuit. In one example, the system 100 can be provided as a circuit (e.g., integrated circuit, discrete circuit, combination of integrated circuit and discrete circuits) for monitoring a power supply (or reference voltages/signals) and generating a signal if a supply or reference voltage crosses a predetermined threshold. The circuit 100 utilizes clocked sample circuits to periodically store reference voltages (indicative of power supply output voltage) as charges (e.g., on a capacitor) versus monitoring the reference voltages from conventional resistive voltage dividers which would undesirably consume energy in the circuit if employed.

The circuit 100 includes a first sample circuit 110 that periodically samples a first reference voltage derived from a high output rail of a voltage source 120 and generates a first sampled output voltage for a voltage supervisor 130. The voltage source 120 can be a power supply in one example or a reference signal/voltage to be monitored. The first reference voltage is shown as input PREFH which is an acronym for periodic reference high. Not only is the reference voltage PREFH periodically sampled by the sample circuit 110 to conserve power over a voltage divider implementation, but the reference voltage PREFH can also be periodically enabled and disabled to further conserve power in the overall circuit 100. A second sample circuit 140 periodically samples a second reference voltage PREFL associated with a low output rail of the voltage source 120 and generates a second sampled output voltage to be monitored by the voltage supervisor 130. Similar to PREFH, PREFL is an acronym for periodic reference low which is derived from the low output rail of the voltage source 120 and can also be periodically enabled and disabled to further conserve power in the circuit 100. The voltage supervisor 130 monitors the first sampled output voltage and the second sampled output voltage from the first sample circuit 110 and the second sample circuit 140 and generates a trip point signal (e.g., high if supply is detected above threshold and low when supply falls below threshold) based on the power supply output voltage crossing a predetermined threshold.

The circuit 100 can be employed to detect over-voltage or under-voltage conditions based upon how references are monitored and in which direction the voltage source output voltage crosses the threshold. For example, if a 2.5V threshold were established for an under-voltage condition, and if the source voltage fell below 2.5V as detected by the voltage monitor 130, and if the power supply were to fall below 2.5V, then the trip point detect signal could switch (e.g., from high to low) to indicate that an under-voltage condition has been detected. In another example, if a 5V threshold were established, and the voltage source 120 were detected above 5V by the supply voltage supervisor 130, then the trip point detect signal could switch (e.g., from low to high) indicating the over-voltage condition. Also, as used herein, output high rail and low rail nomenclature are considered relative terms to describe opposite nodes on the voltage source 120. For example, in one instance the high output rail could be positive and the low output rail could be ground. In another case, the high output rail could be a positive voltage and the low output rail a negative voltage. In yet another example, the high output rail could be a negative voltage and the low output rail could be some negative value even more negative than the negative value of the high output rail. Various combinations are possible and can be similarly monitored via sampled references as described herein.

In one example, the predetermined threshold can be set by programming a predetermined charge on a capacitor to store the first reference voltage PREFH in the first sample circuit 110 according to a clock input applied to each sample circuit. The threshold is also set by programming a predetermined charge for a second capacitor to store the second reference voltage PREFL in the second sample circuit 140, where the combination (e.g., summation) of the stored charges in the respective sample circuits forms the predetermined threshold. Programming can be a combination of timing and/or reference voltage levels where higher reference voltages can apply more charge and holding the reference voltage on the storage cap for longer periods of time can also store additional charge.

The voltage supervisor 130 can add the voltages stored on the first and second capacitors in the sample circuits 110 and 140 to determine the predetermined threshold and to generate the trip point signal when the voltage source 120 output voltage crosses the predetermined threshold. The sample circuits 110 and 140 can form sample and hold circuits where each circuit includes a switch that is periodically clocked to store the predetermined charges on the first and second capacitor of the respective circuits. In one specific example, the switches can be periodically closed inside the sample circuits for about 1 microsecond to about 1 millisecond at a switch closure rate of greater than once per millisecond to store the predetermined charges on the first and second capacitor (e.g., close switches for 1 millisecond at a rate of once every 2 seconds).

As will be described below with respect to FIG. 2, a third sample circuit can be provided that periodically samples a third reference voltage derived from the high output rail of the voltage source 120. The third sample circuit generates a third sampled output voltage that is monitored by the voltage supervisor 130 to provide hysteresis for the generation of the trip point signal. In other words, as voltage is again brought back up on the voltage source 120, a different threshold is established to reset the trip point detect signal than what it took to activate the signal on the way down. Such hysteresis is useful since voltage output of the voltage source 120 is typically a non-linear function and the hysteresis provides stability from oscillation in the circuit 100 during such non-linear rises in voltage.

As noted above, the first reference voltage PREFH and the second reference voltage PREFL can be periodically enabled prior to being sampled by the first and second sample circuits 110 and 140, and disabled after being sampled by the first and second sample circuits to conserve power in the generation of the first and second reference voltages. In one specific example, the voltage supervisor 130 can be a comparator that monitors the first sampled output voltage and the second sampled output voltage from the first and second sample circuits 110 and 140 and generates the trip point signal based on the voltage source 120 output voltage crossing the predetermined threshold. In a more elaborate example, the voltage supervisor 130 could be a processor that monitors the first sampled output voltage and the second sampled output voltage from the first and second sample circuits (e.g., via A/D converter) and generates the trip point signal based on the voltage source output voltage crossing the predetermined threshold.

It is noted that the examples described herein can be provided via different analog and/or digital circuit implementations. For instance, in some cases, field effect transistors can be employed and in other cases junction transistors or diodes employed. Some components can be employed as discrete implementations such as a comparator comparing a reference signal to a control signal and in other examples, controllers operating via processor instructions and exchanging data via D/A and A/D converters could be employed to monitor voltages and generate trip point signals within the circuit 100. In another example, a microcontroller or other control circuitry capable of digitizing sampled voltage parameters, storing digital interpretations of these parameters in its memory, and associating acquired values with events in the circuit 100 operation. This includes performing logical and arithmetical operations with the acquired values.

Figure 2:
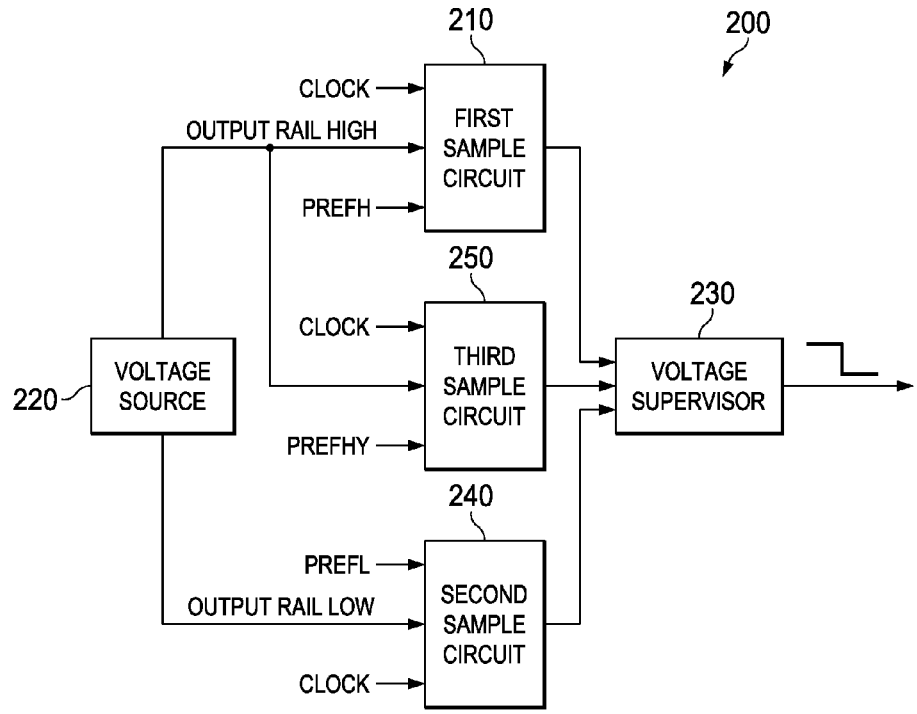
FIG. 2 illustrates a voltage supervisor circuit having hysteresis that employs sampled reference voltages to conserve power in the circuit.

FIG. 2 illustrates a voltage supervisor circuit 200 having hysteresis that employs sampled reference voltages to conserve power in the circuit. Similar to the circuit 100 above, the circuit 200 includes a first sample circuit 210 that periodically samples a first reference voltage derived from a high output rail of a voltage source 220 (e.g., power supply output or reference signal) and generates a first sampled output voltage for a voltage supervisor 230. The first reference voltage is shown as input PREFH which is an acronym for periodic reference high. A second sample circuit 240 periodically samples a second reference voltage PREFL associated with a low output rail of the voltage source 220 and generates a second sampled output voltage to be monitored by the voltage supervisor 230. Similar to PREFH, PREFL is an acronym for periodic reference low which is derived from the low output rail of the voltage source 220 and can also be periodically enabled and disabled to further conserve power in the circuit 200. The voltage supervisor 230 monitors the first sampled output voltage and the second sampled output voltage from the first sample circuit 210 and the second sample circuit 240 and generates a trip point signal (e.g., high if voltage source is detected above threshold and low when source falls below threshold) based on the voltage source output voltage crossing a predetermined threshold.

A third sample circuit 250 can be provided that periodically samples a third reference voltage PREFHY derived from the high output rail of the voltage source 220. PREFH is an acronym for periodic reference hysteresis which is derived from a different voltage point than PREFH—both of which are derived from the high output rail. The third sample circuit 250 generates a third sampled output voltage that is monitored by the voltage supervisor 230 to provide hysteresis for the generation of the trip point signal. As noted previously, as voltage is again brought back up on the power supply 220, a different threshold is established to reset the trip point detect signal than what it took to activate the signal on the way down. Various examples of sample circuits, reference voltages, and supply voltage supervisors will now be illustrated and described below with respect to FIGS. 3-5.

Figure 3:
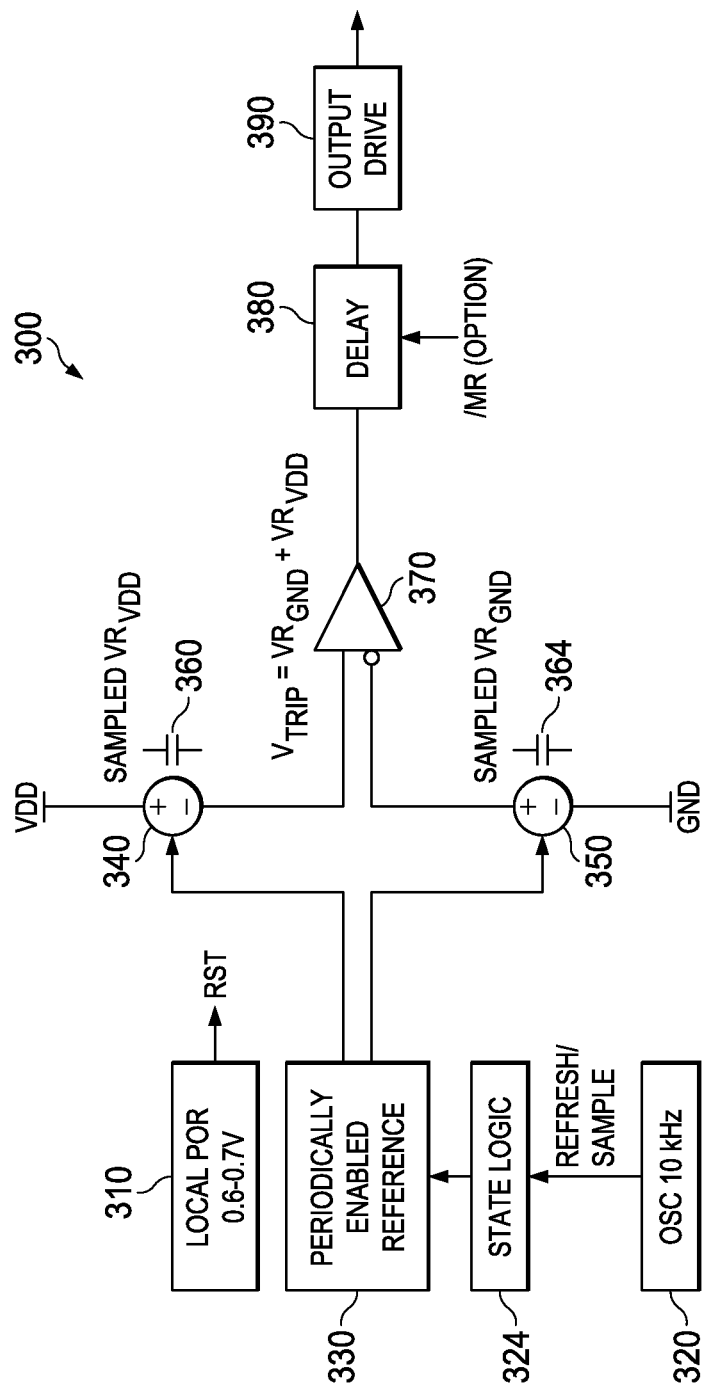
FIG. 3 illustrates a comparator supervisor circuit that employs sampled reference voltages to conserve power in the circuit.

FIG. 3 illustrates a comparator supervisor circuit 300 that employs sampled reference voltages to conserve power in the circuit. In this example, a voltage source such as a power supply is not shown but the high output rail is shown as VDD and the low output rail from the source is shown as ground (GND). In one example, VDD for circuit operation can range from 0.6V to 6.5V. A local reset circuit 310 can be employed to reset operations within the circuit 300. A clock 320 (e.g., 10 khz) and state logic 324 drive timing in the circuit 300 such as to control sampling of reference voltages and to periodically enable and disable a voltage reference 330. The periodic output of the reference 330 is shown at 340 which is derived from VDD and at 350 which based upon GND. A symbolic capacitor 360 representing a sample and hold circuit stores charge represented as Sampled VRVDD which is voltage reference with respect to VDD. A symbolic capacitor 364 representing a second sample and hold circuit stores charge represented as Sampled VRGND which is voltage reference with respect to ground. Each of the capacitors can sample the periodic references 340 and 350 based upon the clock 320 and state logic 324.

A comparator 370 monitors the sampled voltages 360 and 364 to generate a voltage VTRIP which is the summation of sampled voltages VRVDD and VRGND. For example, if capacitor 364 were programmed at 700 millivolts, and the capacitor 360 were programmed at 200 millivolts, the predetermined threshold for the comparator 370 would be set for 900 millivolts. Thus, if the supply voltage VDD were to drop below 900 millivolts, the comparator 370 would generate a trip signal as described previously. Threshold range examples based on an input supply range for the circuit 300 of about 0.6V to 6.5V can be programmed to about 0.9V to about 6.5V based upon the programmed voltages on capacitor 360 and 364. Output from the comparator 370 can be sent though a delay circuit 380 which can in turn drive an output drive circuit 390. As shown, the delay circuit 380 can be optionally driven from a master reset signal.

Figure 4:
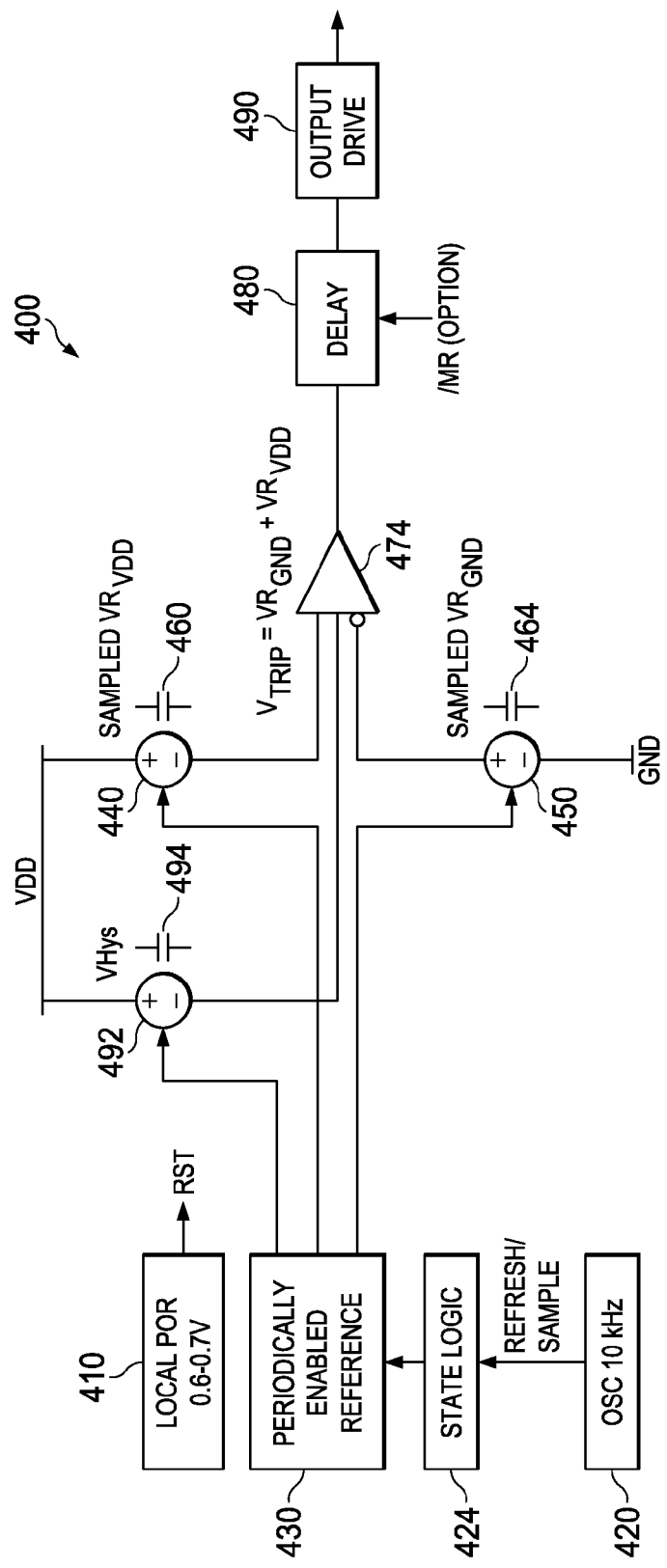
FIG. 4 illustrates a comparator supervisor circuit having hysteresis that employs sampled reference voltages to conserve power in the circuit.

FIG. 4 illustrates a comparator supervisor circuit 400 having hysteresis that employs sampled reference voltages to conserve power in the circuit. Similar to the example shown above with respect to FIG. 3, a power supply is not shown but the high output rail is shown as VDD and the low output rail from the supply is shown as ground (GND). In one example, VDD for circuit operation can range from 0.6V to 6.5V. A local reset circuit 410 can be employed to reset operations within the circuit 400. A clock 420 (e.g., 10 khz) and state logic 424 drive timing in the circuit 400 such as to control sampling of reference voltages and to periodically enable and disable a voltage reference 430. The periodic output of the reference 430 is shown at 440 which is derived from VDD and at 450 which based upon GND. A symbolic capacitor 460 representing a sample and hold circuit stores charge represented as Sampled VRVDD which is voltage reference with respect to VDD. A symbolic capacitor 464 representing a second sample and hold circuit stores charge represented as Sampled VRGND which is voltage reference with respect to ground. Each of the capacitors can sample the periodic references 440 and 450 based upon the clock 420 and state logic 424.

A comparator 470 monitors the sampled voltages 460 and 464 to generate a voltage VTRIP which is the summation of sampled voltages VRVDD and VRGND as described above. Similar to the circuit described in FIG. 3, if capacitor 464 were programmed at 700 millivolts, and the capacitor 460 were programmed at 200 millivolts, the predetermined threshold for the comparator 470 would be set for 900 millivolts. Thus, if the supply voltage VDD were to drop below 900 millivolts, the comparator 470 would generate a trip signal as described previously. Threshold range examples based on an input supply range for the circuit 400 of about 0.6V to 6.5V can be programmed to about 0.9V to about 6.5V based upon the programmed voltages on capacitor 460 and 464. Output from the comparator 470 can be sent though a delay circuit 480 which can in turn drive an output drive circuit 490. As shown, the delay circuit 480 can be optionally driven from a master reset signal.

A third periodic output 492 can apply charge to a third sample and hold circuit shown as symbolic capacitor 494. The sample and hold 494 periodically samples a third reference voltage VHYS derived from VDD of the power supply. The third sample circuit 494 generates a third sampled output voltage that is monitored by the comparator 470 to provide hysteresis for the generation of the trip point signal. As noted previously, as voltage is again brought back up on the power supply, a different threshold is established to reset the trip point detect signal than what it took to activate the signal on the way down.

Figure 5A:
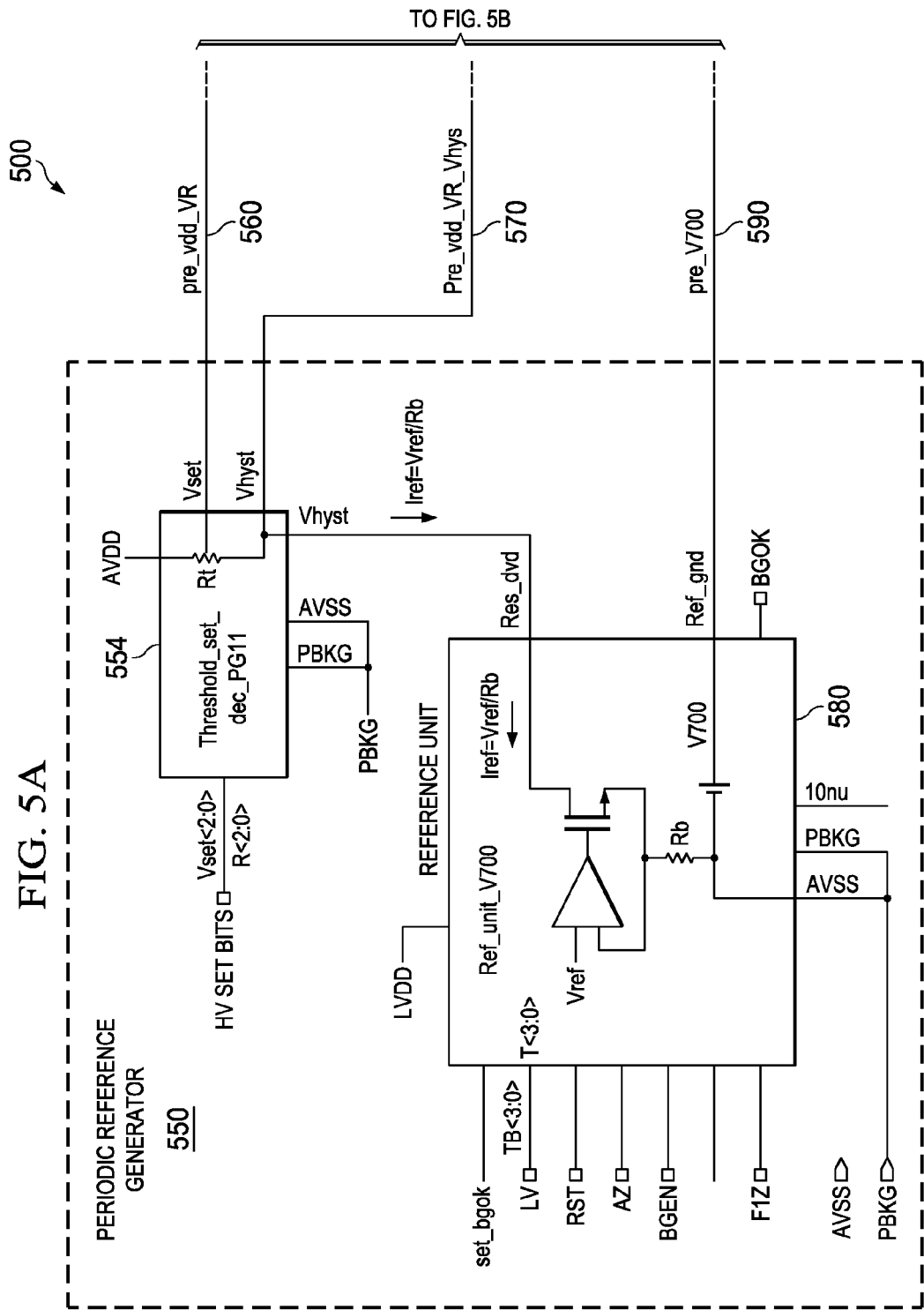
FIGS. 5a and 5b illustrate an integrated circuit to monitor supply voltages by utilizing sampled reference voltages to conserve power in the circuit.
Figure 5B:
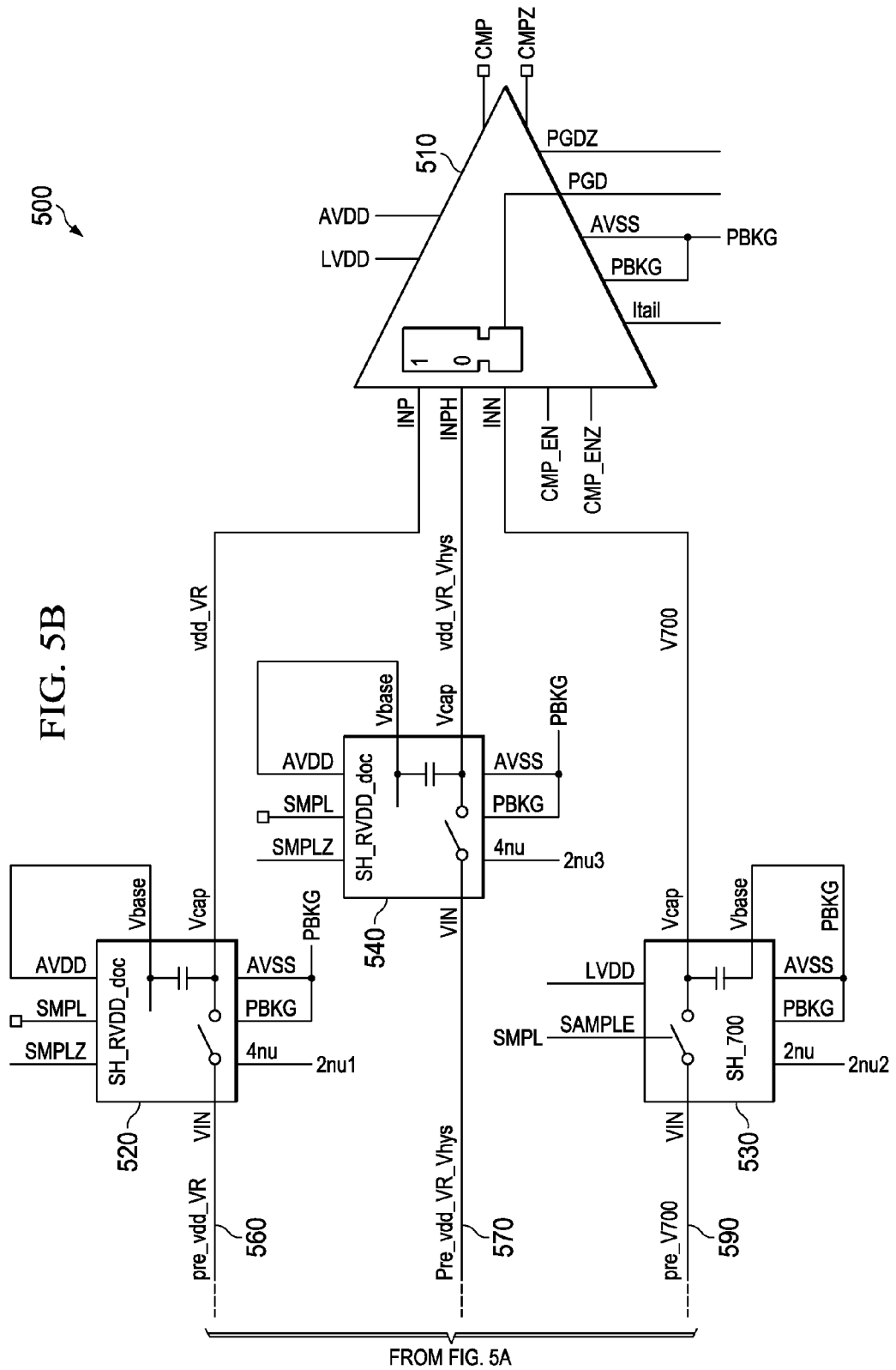

FIGS. 5a and 5b illustrate an integrated circuit 500 to monitor supply voltages by utilizing sampled reference voltages to conserve power in the circuit. At FIG. 5b, the circuit 500 includes a comparator 510 that operates as the supply voltage supervisor described above. Threshold references for the comparator 510 are set by sample and hold circuits 520 and 530. A sample and hold 540 provides an additional hysteresis input to the comparator 510. As shown, each of the sample and holds 520 through 540 include a switch to store charge on a capacitor, wherein the switch is driven by a clock circuit as previously described. At FIG. 5a, a periodic reference generator 550 supplies periodically switched reference voltages to the sample and holds 520 though 540. A resistive divider 554 supplies switched reference voltages 560 and 570 based on the high output rail. A switch circuit 580 enables periodic current to flow in the resistive divider 554 and also establishes the low output rail reference 590 for the sample and hold 530. As noted previously, other examples of the circuit 500 are possible. For example, the comparator 510 could be replaced by a processor or controller that monitors the sampled reference voltages and generates a trip point. In yet another example, a single sample and hold could be employed by the processor to periodically monitor the reference voltages based up a sampled A/D input.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    a first sample circuit that periodically samples a first reference voltage derived from a high output rail of a voltage source and generates a first sampled output voltage;
    a second sample circuit that periodically samples a second reference voltage associated with a low output rail of the voltage source and generates a second sampled output voltage; and
    a voltage supervisor that generates a trip point signal when a combination of the first and second sampled output voltage crosses a predetermined threshold indicating that the voltage source output voltage has fallen below a desired output voltage.

2. The circuit of claim 1, wherein the predetermined threshold defines a trip point for an over-voltage condition or an under-voltage condition of the voltage source.

3. The circuit of claim 2, wherein the predetermined threshold is set by programming a predetermined charge for a first capacitor to store the first reference voltage in the first sample circuit and by programming a predetermined charge for a second capacitor to store the second reference voltage in the second sample circuit.

4. The circuit of claim 3, wherein the voltage supervisor adds the voltages stored on the first and second capacitors to determine the predetermined threshold and to generate the trip point signal when the voltage source output voltage crosses the predetermined threshold.

5. The circuit of claim 3, further comprising a first switch and a second switch that are periodically clocked to store the predetermined charges on the first and second capacitor.

6. The circuit of claim 5, wherein the first and second switches are periodically closed for about 1 microsecond to about 1 millisecond at a rate greater than once per millisecond to store the predetermined charges on the first and second capacitor.

7. The circuit of claim 1, further comprising a third sample circuit that periodically samples a third reference voltage derived from the high output rail of the voltage source and generates a third sampled output voltage that is monitored by the voltage supervisor to provide hysteresis for the generation of the trip point signal.

8. The circuit of claim 1, wherein the first reference voltage and the second reference voltage are periodically enabled prior to being sampled by the first and second sample circuits and disabled after being sampled by the first and second sample circuits to conserve power in the generation of the first and second reference voltages.

9. The circuit of claim 1, wherein the voltage supervisor is a comparator that monitors the first sampled output voltage and the second sampled output voltage from the first and second sample circuits and generates the trip point signal based on the voltage source output voltage crossing the predetermined threshold.

10. The circuit of claim 1, wherein the voltage supervisor is a processor that monitors the first sampled output voltage and the second sampled output voltage from the first and second sample circuits and generates the trip point signal based on the voltage source output voltage crossing the predetermined threshold.

11. The circuit of claim 1, wherein the voltage source a power supply or a reference signal.

12. An integrated circuit comprising:
    a first sample circuit that periodically samples a first reference voltage derived from a high output rail of a voltage source and generates a first sampled output voltage;
    a second sample circuit that periodically samples a second reference voltage associated with a low output rail of the voltage source and generates a second sampled output voltage;
    a third sample circuit that periodically samples a third reference voltage derived from the high output rail of the voltage source and generates a third sampled output voltage; and
    a comparator to monitor the first sampled output voltage and the second sampled output voltage from the first and second sample circuits and to generate a trip point signal based on the voltage source output voltage crossing a predetermined threshold, wherein the third sampled output voltage is monitored to add hysteresis to the comparator by setting a hysteresis threshold for the comparator.

13. The integrated circuit of claim 12, wherein the first reference voltage, the second reference voltage, and third reference voltage are periodically enabled prior to being sampled by the first, the second, and the third sample circuits and disabled after being sampled by the first, the second, and the third sample circuits to conserve power in the generation of the first, the second, and the third reference voltages.

14. The integrated circuit of claim 12, wherein the predetermined threshold defines a trip point for an over-voltage condition or an under-voltage condition of the voltage source.

15. The integrated circuit of claim 12, wherein the predetermined threshold is set by programming a predetermined charge for a first capacitor to store the first reference voltage in the first sample circuit and by programming a predetermined charge for a second capacitor to store the second reference voltage in the second sample circuit.

16. The integrated circuit of claim 15, wherein the comparator adds the voltages stored on the first and second capacitors to determine the predetermined threshold and to generate the trip point signal when the voltage source output voltage crosses the predetermined threshold.

17. The integrated circuit of claim 15, wherein the hysteresis threshold is set by programming a predetermined charge for a third capacitor to store the third reference voltage in the third sample circuit.

18. The integrated circuit of claim 17, further comprising a first switch, a second switch, and a third switch that are periodically clocked to store the predetermined charges of the first capacitor, the second capacitor, and the third capacitor.

19. An integrated circuit comprising:
    a first sample circuit that periodically samples a first reference voltage derived from a high output rail of a voltage source and generates a first sampled output voltage;

a second sample circuit that periodically samples a second reference voltage associated with a low output rail of the voltage source and generates a second sampled output voltage;

a third sample circuit that periodically samples a third reference voltage derived from the high output rail of the power voltage source and generates a third sampled output voltage, wherein the first reference voltage, the second reference voltage, and third reference voltage are periodically enabled prior to being sampled by the first, the second, and the third sample circuits and disabled after being sampled by the first, the second, and the third sample circuits to conserve power in the generation of the first, the second, and the third reference voltages; and a comparator to monitor the first sampled output voltage and the second sampled output voltage from the first and the second sample circuits and to generate a trip point signal based on the voltage source output voltage crossing a predetermined threshold, wherein the third sampled output voltage is monitored to add hysteresis to the comparator by setting a hysteresis threshold for the comparator.

20. The integrated circuit of claim 19, wherein the predetermined threshold defines a trip point for an over-voltage condition or an under-voltage condition of the voltage source.

\* \* \* \* \*